(12) United States Patent
Yun

(10) Patent No.: US 8,263,456 B2
(45) Date of Patent: Sep. 11, 2012

(54) METHODS OF MANUFACTURING CAPACITOR AND SEMICONDUCTOR DEVICE INCLUDING THE SAME

(75) Inventor: Kwan-Young Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/152,998

(22) Filed: Jun. 3, 2011

(65) Prior Publication Data

US 2011/0237044 A1 Sep. 29, 2011

Related U.S. Application Data

(62) Division of application No. 12/314,201, filed on Dec. 5, 2008, now Pat. No. 7,956,440.

(30) Foreign Application Priority Data

Dec. 7, 2007 (KR) ................................ 2007-126628

(51) Int. Cl.
*H01L 21/8242* (2006.01)
*H01L 21/20* (2006.01)

(52) U.S. Cl. ......... 438/253; 438/239; 438/396; 438/393

(58) Field of Classification Search .................. 438/239, 438/240, 3, 238, 386, 243, 242, 244, 253, 438/250, 393, 387, 396, 399, 255, 398, 665, 438/964, 379
See application file for complete search history.

(56) References Cited

U.S. PATENT DOCUMENTS

| 6,337,267 | B1 | 1/2002 | Yang |
| 6,566,698 | B2 | 5/2003 | Nishihara et al. |
| 2009/0078981 | A1* | 3/2009 | Yokoi ......................... 257/306 |

FOREIGN PATENT DOCUMENTS

| KR | 10-2002-0081798 A | 10/2002 |
| KR | 10-2002-0083577 A | 11/2002 |
| KR | 10-2006-0078259 A | 7/2006 |

* cited by examiner

*Primary Examiner* — Chuong A. Luu
(74) *Attorney, Agent, or Firm* — Lee & Morse

(57) ABSTRACT

A capacitor includes a first capacitor structure on a substrate, the first capacitor structure including a first electrode, a first dielectric layer pattern, and a second electrode, a second capacitor structure on the first capacitor structure, the second capacitor structure including a third electrode, a second dielectric layer pattern, and a fourth electrode, at least one first contact pad on a side of the first electrode, and a wiring structure connecting the at least one first contact pad and the fourth electrode.

19 Claims, 8 Drawing Sheets

METHODS OF MANUFACTURING CAPACITOR AND SEMICONDUCTOR DEVICE INCLUDING THE SAME

CROSS REFERENCE TO RELATED APPLICATION

This is a divisional application based on application Ser. No. 12/314,201, filed Dec. 5, 2008, now U.S. Pat. No. 7,956,440 the entire contents of which is hereby incorporated by reference.

BACKGROUND

1. Technical Field

Embodiments relate to capacitor, a semiconductor device including the same, and associated methods.

2. Description of the Related Art

Semiconductor devices may be manufactured by forming circuit patterns on a semiconductor substrate, e.g., a silicon wafer. For example, an embedded dynamic random access memory (eDRAM) may include a cell region and a logic region. A plurality of memory cells may be formed in the cell region, and logic circuits may be formed in the logic region. The logic circuits may include a plurality of transistors and a plurality of capacitors.

Each of the capacitors may include a lower electrode, a dielectric layer pattern, and an upper electrode. Unit processes such as a deposition process for forming a layer, a photolithography process, an etching process, a planarization process for patterning the layer, etc., may be performed repeatedly to form the capacitors.

However, when processes for the memory cells in the cell region and processes for the logic circuits in the logic region are performed separately, costs for manufacturing the semiconductor devices may be increased. Accordingly, it is desirable to reduce the number of the unit processes for forming the memory cells and the logic circuits.

In addition, in order to improve the performance of semiconductor devices, it is desirable to increase the capacitances of capacitors. For example, a dielectric layer pattern including a high dielectric material may be used to form capacitors. Also, electrodes and a dielectric layer pattern having an increased effective surface area therebetween may be used to form capacitors.

SUMMARY

Embodiments are therefore directed to a capacitor, a semiconductor device including the same, and associated methods, which substantially overcome one or more of the problems due to the limitations and disadvantages of the related art.

It is therefore a feature of an embodiment to provide a capacitor with an increased capacitance.

It is therefore another feature of an embodiment to provide a method of preparing a semiconductor device including processing the cell region and logic region together, so as to reduce costs for manufacturing the semiconductor devices by reducing the number of unit processes for forming the devices.

At least one of the above and other features and advantages may be realized by providing a capacitor. The capacitor may include a first capacitor structure, a second capacitor structure, at least one first contact pad, and a wiring structure. The first capacitor structure is on a substrate and the first capacitor structure includes a first electrode, a first dielectric layer pattern, and a second electrode. The second capacitor is on the first capacitor structure and the second capacitor structure includes a third electrode, a second dielectric layer pattern, and a fourth electrode. The at least one first contact pad is on a side of the first electrode. The wiring structure connects the at least one first contact pad and the fourth electrode.

The capacitor may further include a first insulation layer having a first opening that at least partially exposes the substrate, wherein at least one first recess is in an inner side surface of the first opening, and the at least one first contact pad is in the at least one first recess.

The capacitor may include a plurality of first contact pads, and the wiring structure may include a plurality of first contact plugs that extend upwardly from the plurality of first contact pads.

The capacitor may further include at least one second contact pad on a side of the third electrode.

The capacitor may further include a second insulation layer having a second opening that at least partially exposes the second electrode, wherein at least one second recess is in an inner side surface of the second opening, and the at least one second contact pad is in the at least one second recess.

At least one of the above and other features and advantages may also be realized by providing a semiconductor device. The semiconductor device may include a transistor in a cell region of a substrate, the transistor including a plurality of impurity regions, a first insulation layer including a plurality of first contact holes and a first opening, wherein the plurality of first contact holes at least partially exposes the plurality of impurity regions, and the first opening at least partially exposes a surface of a logic region of the substrate, and a plurality of second contact plugs within the plurality of first contact holes, at least one third contact plug on at least one of the second contact plugs, a first capacitor structure within the first opening, the first capacitor structure including a first electrode, a first dielectric layer pattern, and a second electrode, a second capacitor structure on the first capacitor structure, the second capacitor structure including a third electrode, a second dielectric layer pattern, and a fourth electrode; at least one first contact pad on a side of the first electrode, and a wiring structure connecting the at least one first contact pad and the fourth electrode.

The semiconductor device may have the plurality of second contact plugs and the first electrode include the same material.

In the semiconductor device, an upper surface of the plurality of second contact plugs and an upper surface of the first electrode may be substantially coplanar.

In the semiconductor device, the at least one third contact plug and the third electrode may include the same material.

In the semiconductor device, an upper surface of the at least one third contact plug and an upper surface of the third electrode may be substantially coplanar.

At least one of the above and other features and advantages may also be realized by providing a method of manufacturing a capacitor. The method may include forming a first insulation layer on a semiconductor substrate, the first insulation layer including a first opening, forming a first capacitor structure in the first opening, the first capacitor structure including a first electrode, a first dielectric layer pattern, and a second electrode, forming a second capacitor structure on the first capacitor structure, the second capacitor structure including a third electrode, a second dielectric layer pattern, and a fourth electrode, forming at least one first contact pad on a side of the first electrode, and forming a wiring structure connecting the at least one first contact pad and the fourth electrode.

Forming the at least one first contact pad may include forming at least one first recess in an inner side surface of the first opening, and forming the at least one first contact pad in the at least one first recess.

The method may further include forming a second insulation layer on the first insulation layer, wherein the second insulation layer has a second opening at least partially exposing a surface of the second electrode, and the second capacitor structure is within the second opening.

The method may further include forming at least one second contact pad on a side of the third electrode.

Forming the at least one second contact pad may include forming at least one second recess in an inner side surface of the second opening, and forming the at least one second contact pad in the at least one second recess.

At least one of the above and other features and advantages may also be realized by providing a method of manufacturing a semiconductor device. The method may include forming a transistor in a cell region of a substrate, the transistor including a plurality of impurity regions, forming a first insulation layer including a plurality of first contact holes and a first opening, wherein the plurality of first contact holes at least partially exposes the plurality of impurity regions and the first opening at least partially exposes a surface of a logic region of the substrate, forming a plurality of second contact plugs within the plurality of first contact holes, forming at least one third contact plug on at least one of the second contact plugs, forming a first capacitor structure within the first opening, the first capacitor structure including a first electrode, a first dielectric layer pattern, and a second electrode, forming a second capacitor structure on the first capacitor structure, the second capacitor structure including a third electrode, a second dielectric layer pattern, and a fourth electrode, forming at least one first contact pad on a side of the first electrode and forming a wiring structure connecting the at least one first contact pad and the fourth electrode.

The steps of forming the second contact plugs and the first electrode may occur substantially simultaneously.

The steps of forming the at least one third contact plug and the third electrode may occur substantially simultaneously.

The step of forming the at least one first contact pad may include forming at least one first recess on an inner side surface of the first opening, and forming the at least one first contact pad in the at least one first recess.

The method may further include forming a second insulation layer on the first insulation layer, wherein the second insulation layer has a second opening at least partially exposing a surface of the second electrode, and the second capacitor structure is within the second opening, and forming at least one second contact pad on a side of the third electrode, wherein forming the at least one second contact pad includes at least one second recess in an inner side surface of the second opening, and forming the at least one second contact pad in the at least one second recess.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
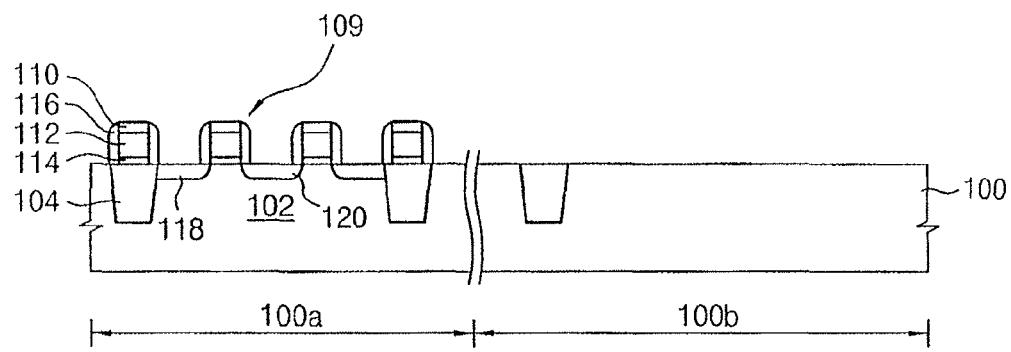
FIGS. 1 to 15 illustrate cross-sectional views and plan views of a method of manufacturing a semiconductor device in accordance with an exemplary embodiment.

Korean Patent Application No. 2007-126628, filed on Dec. 7, 2007, in the Korean Intellectual Property Office, and entitled: "Capacitor, Semiconductor Device Including the Capacitor, Method of Forming the Capacitor, and Method of Manufacturing the Semiconductor Device Including the Capacitor," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a high dielectric material" may represent a single compound, e.g., tantalum oxide, or multiple compounds in combination, e.g., tantalum oxide mixed with hafnium oxide.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring to FIG. 1, an isolation layer 104 may be formed in a semiconductor substrate 100, e.g., a silicon wafer, to define active regions 102. For example, the active regions 102 may be electrically isolated by the isolation layer 104 using a shallow trench isolation (STI) process. The semiconductor substrate 100 may include a cell region 100a and a logic region 100b.

A gate insulation layer may be formed on the active regions 102 and the isolation layer 104. The gate insulation layer may include, e.g., a silicon oxide layer. The silicon oxide layer may be formed by, e.g., a thermal oxidation process or a chemical vapor deposition (CVD) process.

A first conductive layer and a mask layer may be sequentially formed on the gate insulation layer. The first conductive layer and the mask layer may function as a gate conductive layer and a gate mask layer, respectively. The first conductive layer may include, e.g., a doped polysilicon layer. Additionally, a metal silicide layer may be formed on the doped polysilicon layer. The mask layer may include, e.g., a silicon nitride layer.

The mask layer may be patterned to form gate masks 110 on the first conductive layer. The mask layer may be patterned by, e.g., a photolithography and etching process.

The first conductive layer and the gate insulation layer may be patterned by, e.g., an anisotropic etching process using the gate mask 110 as a mask to form a gate structure on the cell region 100a of the semiconductor substrate 100. The gate structure may include a gate electrode 112 and a gate insulation layer pattern 114.

Alternatively, after a photoresist pattern is formed on the mask layer, the gate structure may be formed by an etching process using the photoresist pattern as an etching mask.

A spacer layer may be formed on the semiconductor substrate 100 including the gate masks 110, the gate electrodes 112, and the gate insulation patterns 114. Then, the spacer layer may be anisotropically etched to form a gate spacer 116 on sidewalls of the gate mask 110, the gate electrode 112, and the gate insulation layer pattern 114.

First impurity regions 118 and second impurity regions 120 may be formed on a surface of the active region 102 adjacent to the gate electrodes 112 to thereby complete a plurality of transistors 109 on the cell region 100a of the semiconductor substrate 100. Each of the first impurity regions 118 and the second impurity regions 120 may function as a source/drain, and two transistors 109 sharing the second impurity region 120 may be formed in the active region 102.

Each of the first and the second impurity regions 118 and 120 may include a low-concentration impurity region and a high-concentration impurity region. The low-concentration impurity region may be formed before forming the gate spacers 116 and the high-concentration impurity region may be formed after forming the gate spacers 116.

Figure 2:
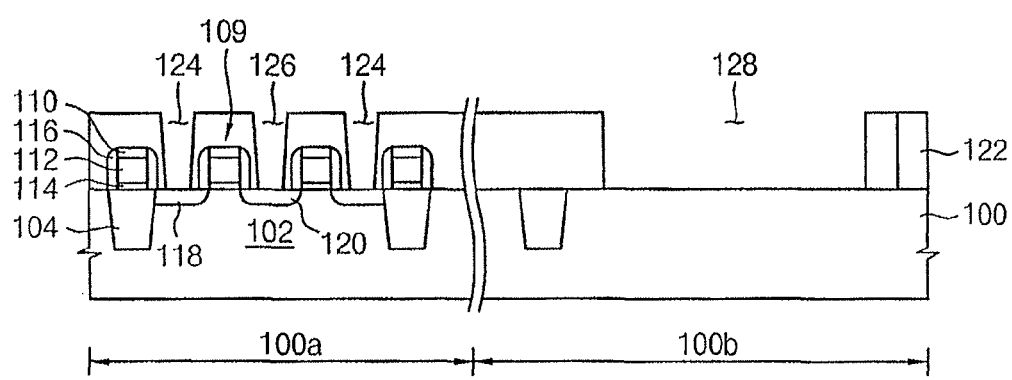

Referring to FIG. 2, a first insulation layer 122 may be formed on the semiconductor substrate 100 including the transistors 109 formed thereon. The first insulation layer 122 may include, e.g., silicon oxide. The first insulation layer 122 may be formed by, e.g., a CVD process. The first insulation layer 122 may be planarized by a planarization process, e.g., a chemical mechanical polishing (CMP) process.

The first insulation layer 122 may be patterned to form a first contact hole 124, a second contact hole 126, and a first opening 128. For example, after a photoresist pattern is formed on the first insulation layer 122, the first and second contact holes 124 and 126 and the first opening 128 may be formed by, e.g., an etching process using the photoresist pattern as a mask. The first and second impurity regions 118 and 120 may be exposed by the first and second contact holes 124 and 126. A surface of the logic region 100b of the substrate 100 may be partially exposed by the first opening 128.

Figure 3:
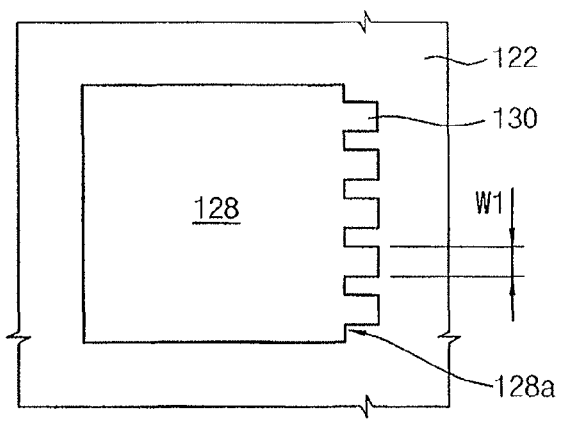

Referring to FIG. 3, a plurality of first recesses 130 may be formed in an inner side surface 128a of the first opening 128.

The first recesses 130 may partially expose the surface of the logic region 100b of the substrate 100 and may extend upwardly from an upper surface of the substrate 100 to an upper surface of the first insulation layer 122.

Each of the first recesses 130 may have a width (W1) smaller than the diameters of the first and second contact holes 124 and 126, so that the first recesses 130 may be completely filled with a subsequently formed first electrode layer 132.

Figure 4:
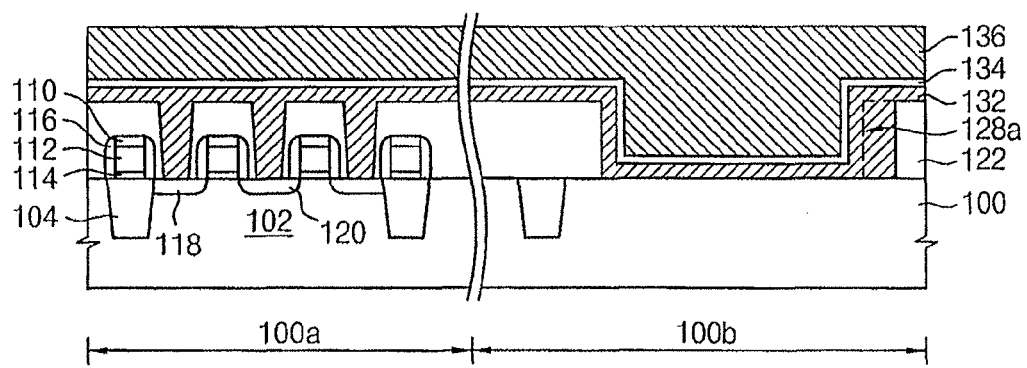

Referring to FIG. 4, the first electrode layer 132 may be formed on the first insulation layer 122 to completely fill the first and second contact holes 124 and 126 and the first recesses 130. The first electrode layer 132 may be formed on the upper surface of the first insulation layer 122, the inner side surfaces of the first opening 128 and the surface of the substrate 100 exposed by the first opening 128. The first electrode layer 132 may be formed conformally on the inner side surfaces of the first opening 128. The first electrode layer 132 may include a metal, e.g., tungsten (W).

In another exemplary embodiment, a first barrier layer may be formed on the substrate 100 before forming the first electrode layer 132. The first barrier layer may include, e.g., a titanium layer and a titanium nitride layer. The first barrier layer may function as an ohmic layer between the first electrode layer 132 and the first and second impurity regions 118 and 120.

A first dielectric layer 134 may be formed on the first electrode layer 132. The first dielectric layer 134 may include, e.g., silicon nitride or a high dielectric material having a dielectric constant higher than that of silicon nitride. The silicon nitride may be formed by, e.g., a plasma-enhanced chemical vapor deposition (PECVD) process or a low-pressure chemical vapor deposition (LPCVD) process. The high dielectric material may be formed by, e.g., a CVD process or an atomic layer deposition (ALD) process. The high dielectric material may include, e.g., tantalum oxide, hafnium oxide, aluminum oxide, and/or zirconium oxide.

In another exemplary embodiment, a second barrier layer may be formed between the first electrode layer 132 and the first dielectric layer 134. The second barrier layer may prevent the first electrode layer 132 and the first dielectric layer 134 from reacting with each other, and may further improve the surface morphology of the first electrode layer 132. The second barrier layer may include, e.g., a titanium nitride layer.

A second electrode layer 136 may be formed on the first dielectric layer 134. The second electrode layer 136 may include, e.g., tungsten. The second electrode layer 136 may completely fill the first opening 128.

In another exemplary embodiment, a third barrier layer may be formed between the first dielectric layer 134 and the second electrode 136. The third barrier layer may prevent the first dielectric layer 134 and the second electrode layer 136 from reacting with each other, and may improve the surface morphology of the second electrode layer 132. The third barrier layer may include a titanium nitride layer.

Figure 5:
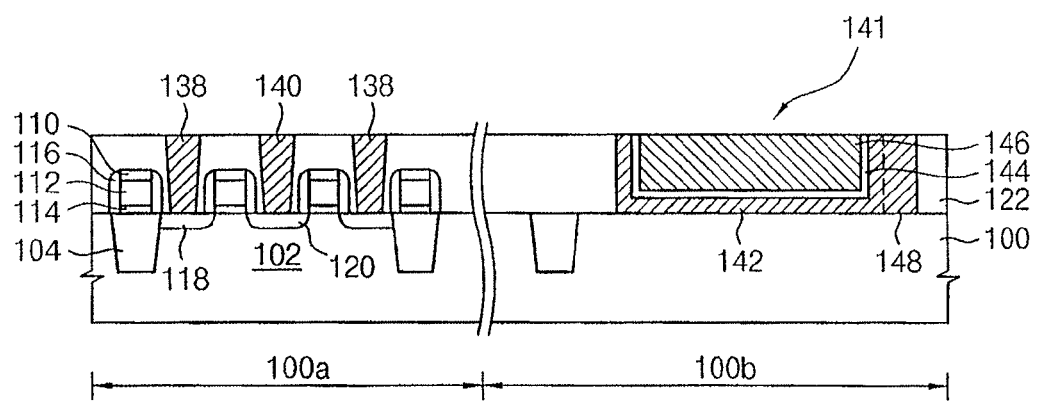
Figure 6:
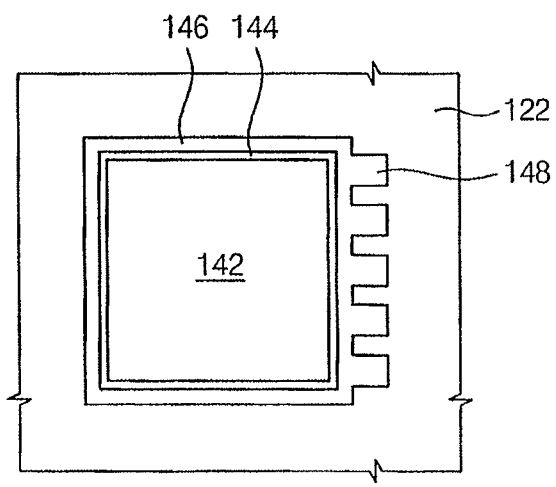

Referring to FIGS. 5 and 6, the second electrode layer 136, the first dielectric layer 134, and the first electrode layer 132 may be partially removed until the first insulation layer 122 is exposed, using, e.g., a CMP process.

As a result, a first contact plug 138 and a second contact plug 140 may be formed in the cell region 100a of the semiconductor substrate 100 to be connected to the first and second impurity regions 118 and 120. At the same time, a first capacitor structure 141 including a first electrode 142, a first dielectric layer pattern 144 and a second electrode 146 may be formed within the first opening 128 in the logic region 100b of the semiconductor substrate 100. Also at the same time, a plurality of first contact pads 148 in a side of the first electrode 142 may be formed within the first recesses 130.

Figure 7:
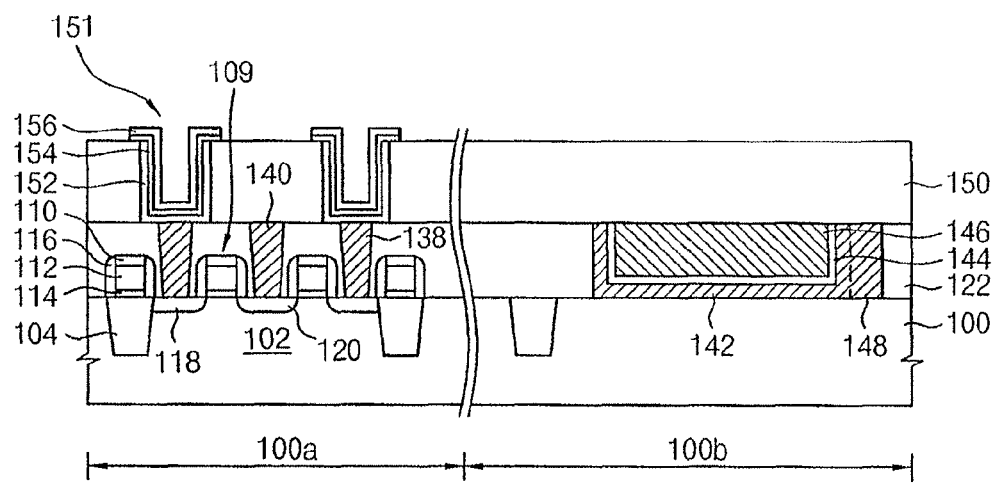

Referring to FIG. 7, a second insulation layer 150 may be formed on the first insulation layer 122, the first and second contact plugs 138 and 140, and the first capacitor structure 141. The second insulation layer may include, e.g., silicon oxide.

The second insulation layer may be used as a mold layer for forming cell capacitors 151 that are connected the transistors 109. The second insulation layer 150 may be patterned to form second openings exposing the first contact plugs 138. The second openings may be formed, e.g., by a photolithography process for forming a photoresist pattern and an etching process using the photoresist pattern as an etching mask.

Lower electrodes 152 having hollow cylindrical shapes may be formed in each of the second openings. For example, after a conformal lower electrode layer is formed, e.g., using CVD or another conformal deposition process, on the second insulation layer having the openings, the lower electrode layer may be planarized by a CMP process until the second insulation layer is exposed, thereby separating the respective lower electrodes 152.

A conformal hollow dielectric layer 154 and a conformal hollow upper electrode 156 may be formed on each of the lower electrodes 152. Thus, memory cells including the cell transistors 109 and the cell capacitors 151 may be formed in the cell region 100a of the semiconductor substrate 100.

As mentioned above, the cell capacitors 151 having the cylindrical shapes may be formed in the cell region 100a of the semiconductor substrate 100; however, example embodiments are not limited thereto. Cell capacitors 151 having stacked structures may be formed on the first contact plugs 138 and the first insulation layer 122.

Figure 8:
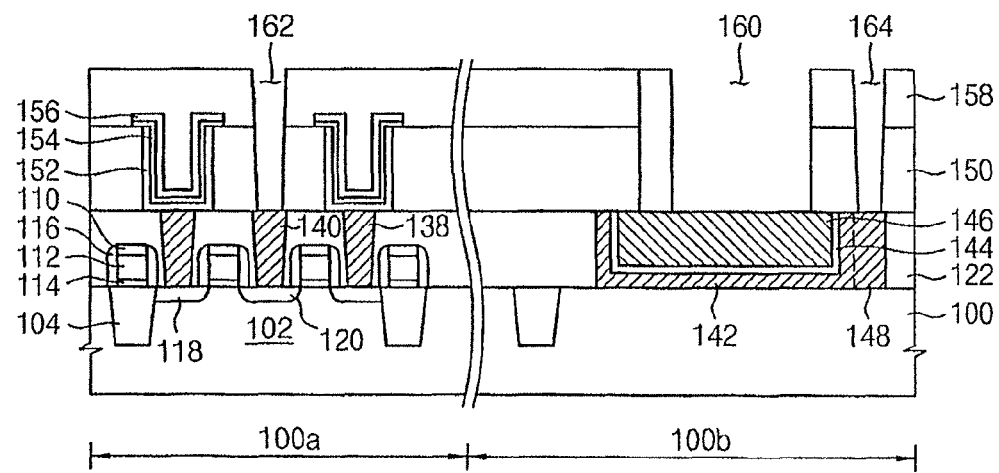

Referring to FIG. 8, a third insulation layer 158 may be formed on the cell capacitors 151 and the second insulation layer 150. The third insulation layer 158 may include the same material as that of the second insulation layer 150. The upper surface of the third insulation layer 158 may be planarized by a planarization process such as a CMP process or an etch-back process. The third insulation layer 158 may fill the hollows in the upper electrodes 156.

The second and third insulation layers 150 and 158 may be patterned to form a third opening 160, a third contact hole 162, and a fourth contact hole 164. The third opening 160 may partially expose the second electrode 146, the third contact hole 162 may expose the second contact plug 140, and the fourth contact hole 164 may expose the first contact pads 148. The second and the third insulation layers 150 and 158 may be patterned by a photolithography and etching process. The third opening 160, the third contact hole 162, and the fourth contact hole 164 may be formed at the same time.

Figure 9:
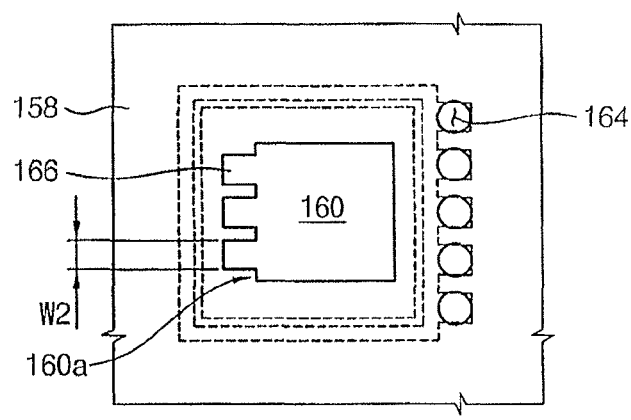

Referring to FIG. 9, a plurality of second recesses 166 may be formed in an inner side surface 160a of the third opening 160. The second recesses 166 may partially expose the second electrode 146 and may extend upwardly from an upper surface of the second electrode 146 to an upper surface of the third insulation layer 158.

Each of the second recesses 166 may have a width (W2) smaller than the diameters of the third and fourth contact holes 162 and 164, so that the second recesses 166 may be completely filled with a subsequently formed third electrode layer 168.

Figure 10:
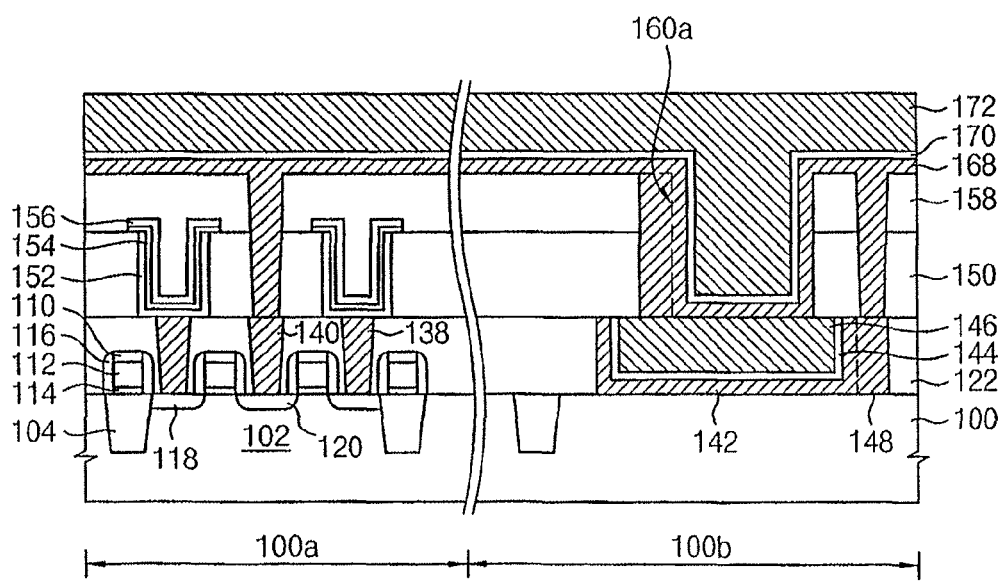

Referring to FIG. 10, a third electrode layer 168 may be formed on the third insulation layer 158 to completely fill the third and fourth contact holes 162 and 164, and the second recesses 166. The third electrode layer 168 may be formed on the upper surface of the third insulation layer 158, the inner side surfaces of the third opening 160, and the surface of the second electrode 146 exposed by the third opening 160. The third electrode layer 168 may be formed conformally on the inner side surfaces of the third opening 160 to leave a hollow therein, and may completely fill the third contact hole 162 and the fourth contact hole 164.

The third electrode layer 168 may include a metal, e.g., tungsten (W).

A second dielectric layer 170 may be formed on the third electrode layer 168. The second dielectric layer 170 may include, e.g., silicon nitride or a high dielectric material having a dielectric constant higher than that of silicon nitride. The silicon nitride may be formed by, e.g., a PECVD process or an LPCVD process. The high dielectric material may be formed by, e.g., a CVD process or an ALD process. The high dielectric material may include tantalum oxide, hafnium oxide, aluminum oxide, and/or zirconium oxide.

In another exemplary embodiment, a fourth barrier layer may be formed between the third electrode layer 168 and the second dielectric layer 170. The fourth barrier layer may prevent the third electrode layer 168 and the second dielectric layer 170 from reacting with each other, and may improve the surface morphology of the third electrode layer 168. The fourth barrier layer may include, e.g., a titanium nitride layer.

A fourth electrode layer 172 may be formed on the fourth dielectric layer 170. The fourth electrode layer 172 may include tungsten. The fourth electrode layer 172 may completely fill the third opening 160.

In another exemplary embodiment, a fifth barrier layer may be formed between the second dielectric layer 170 and the fourth electrode 172. The fourth barrier layer may prevent the second dielectric layer 170 and the fourth electrode layer 172 from reacting with each other, and may improve the surface morphology of the fourth electrode layer 172. The fifth barrier layer may include, e.g., a titanium nitride layer.

Figure 11:
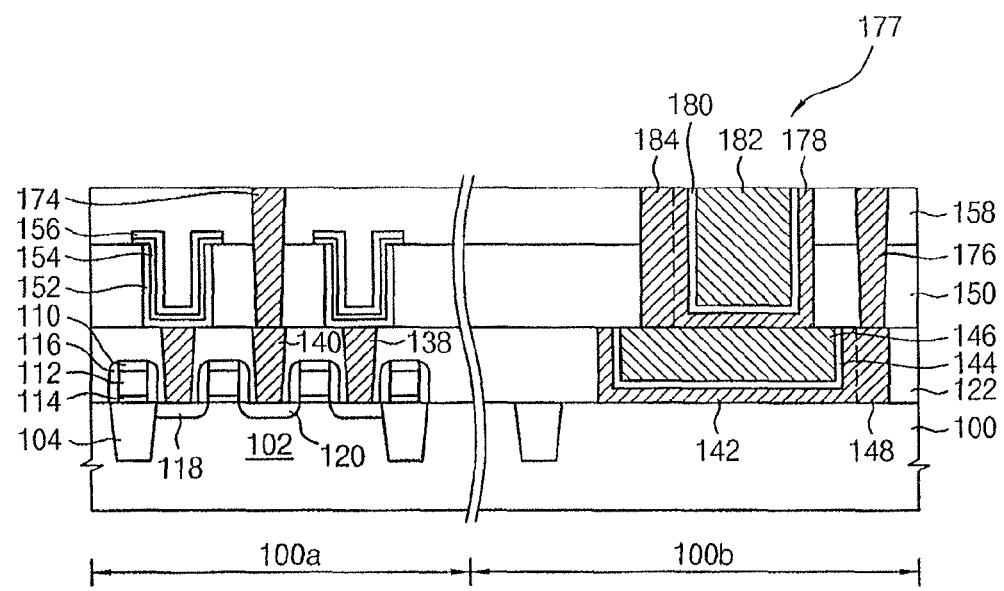
Figure 12:
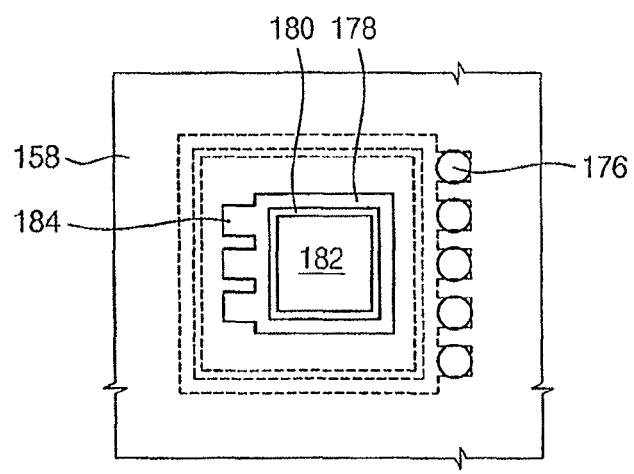

Referring to FIGS. 11 and 12, the fourth electrode layer 172, the second dielectric layer 170, and the third electrode layer 168 may be partially removed until the third insulation layer 158 is exposed, e.g., using a CMP process. As a result, a third contact plug 174 may be formed within the third contact hole 162 in the cell region 100a, the third contact plug 174 connected to the second contact plug 140. At the same time, a fourth contact plug 176 may be formed within the fourth contact hole 164 in the logic region 100b, the fourth contact plug 176 connected to the first contact pad 148. In addition, at the same time, a plurality of second contact pads 184 in a side of the third electrode 178 may be formed within the second recesses 166.

A second capacitor structure 177 including a third electrode 178, a second dielectric layer pattern 180, and a fourth electrode 182 may be formed within the third opening 160.

Figure 13:
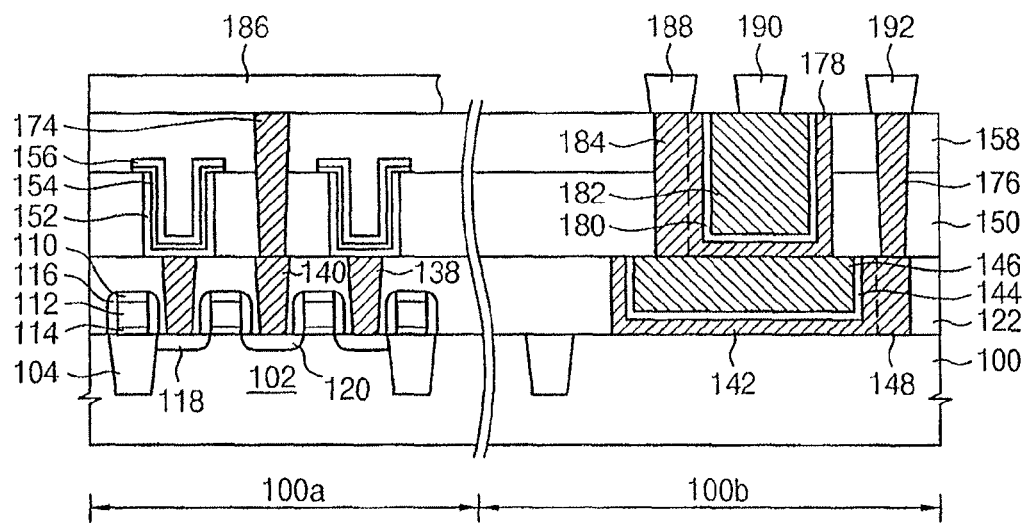
Figure 14:
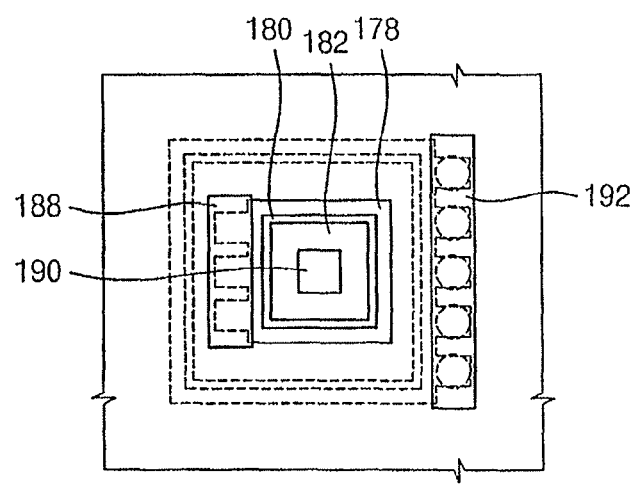

Referring to FIGS. 13 and 14, after the second capacitor structure 177 is formed in the logic region 100b of the substrate 100, a plurality of conductive patterns may be formed on the substrate 100. For example, a first conductive pattern 186 may be formed on the third contact plugs 174. The first conductive pattern 186 may function as a bit line of the memory cells.

A second conductive pattern 188, a third conductive pattern 190, and a fourth conductive pattern 192 may be formed in the logic region 100b of the semiconductor substrate 100. The second conductive pattern 188 may be connected to the second contact pads 184, the third conductive pattern 190 may be connected to the fourth electrode 182, and the fourth conductive pattern 192 may be connected to the fourth contact plugs 176.

The second conductive pattern 188 may extend along a direction in which the second contact pads 184 are arranged. The fourth conductive pattern 192 may extend along a direction in which the fourth contact plugs 176 are arranged.

After a second conductive layer is formed on the third insulation layer 158, the second conductive layer may be patterned to form the first, the second, the third, and the fourth conductive patterns 186, 188, 190, and 192. Alternatively, after a fourth insulation layer (not illustrated) having a plurality of fourth openings (not illustrated) that expose the third contact plugs 174, the second contact pads 184, the fourth electrode 182, and the fourth contact plugs 176 is formed on the third insulation layer 158, the fourth openings may be filled with conductive material to form the first, the second, the third, and the fourth conductive patterns 186, 188, 190, and 192.

In another exemplary embodiment (not shown), only one first contact pad may be formed in the side of the first electrode 142 and only one second contact pad may be formed in the side of the third electrode 178. However, it will be understood that, as mentioned above, a plurality of the first contact pads 148 and a plurality of the second contact pads 184 may be used to provide a more reliable connection with the subsequently formed conductive patterns such as the second conductive pattern 188, the fourth contact plugs 176, and the fourth conductive pattern 192.

Figure 15:
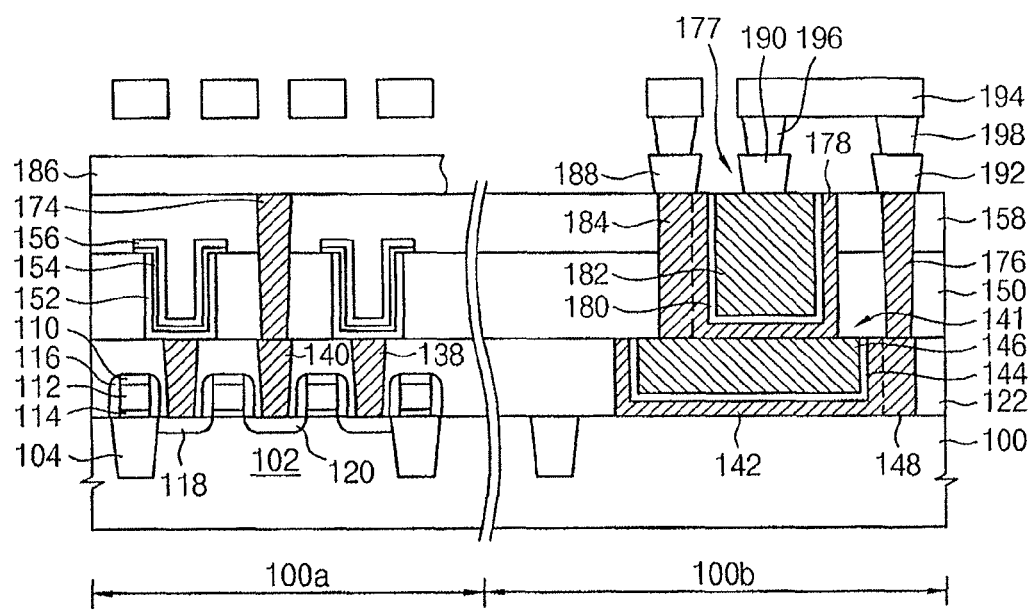

Referring to FIG. 15, a fifth conductive pattern 194 may be formed on the third and the fourth conductive patterns 190 and 192. For example, the third conductive pattern 190 may be electrically connected to the fourth conductive pattern 192 by the fifth conductive pattern 194. The fifth conductive pattern 194 may be connected to the third conductive pattern 190 by the fifth contact plug 196. The fifth conductive pattern may be connected to the fourth conductive pattern 192 by the sixth contact plug 198.

As a result, the first electrode 142 and the fourth electrode 182 may be electrically connected by the first contact pads 148, the fourth contact plugs 176, the fourth conductive pattern 192, the sixth contact plug 198, the fifth conductive pattern 194, the fifth contact plug 196, and the third conductive pattern 190. Thus, the first capacitor structure 141 and the second capacitor structure 177 may be electrically connected in parallel to provide a capacitor having an increased capacitance.

As discussed above, according to some exemplary embodiments, a first capacitor structure and a second capacitor structure may be formed using a reduced number of photolithography processes. Openings for forming the first and second capacitor structures in a logic region 100b may be formed by a photolithography process for forming contact plugs in a cell region 100a, without additional unit processes. Accordingly, costs for manufacturing a semiconductor device including first and second capacitor structures may be reduced considerably. Further, the first capacitor structure and the second capacitor structure may be electrically connected in parallel to thereby provide a capacitor having an increased capacitance.

Exemplary embodiments have been disclosed herein, and although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A method of manufacturing a capacitor, comprising:
forming a first insulation layer on a semiconductor substrate, the first insulation layer including a first opening;

forming a first capacitor structure in the first opening, the first capacitor structure including a first electrode, a first dielectric layer pattern, and a second electrode;

forming a second capacitor structure on the first capacitor structure, the second capacitor structure including a third electrode, a second dielectric layer pattern, and a fourth electrode;

forming at least one first contact pad on a side of the first electrode; and forming a wiring structure connecting the at least one first contact pad and the fourth electrode.

2. The method as claimed in claim 1, wherein forming the at least one first contact pad includes:
forming at least one first recess in an inner side surface of the first opening, and
forming the at least one first contact pad in the at least one first recess.

3. The method as claimed in claim 1, further comprising forming a second insulation layer on the first insulation layer, wherein the second insulation layer has a second opening at least partially exposing a surface of the second electrode, and the second capacitor structure is within the second opening.

4. The method as claimed in claim 3, further comprising forming at least one second contact pad on a side of the third electrode.

5. The method as claimed in claim 4, wherein forming the at least one second contact pad includes:
forming at least one second recess in an inner side surface of the second opening, and
forming the at least one second contact pad in the at least one second recess.

6. The method as claimed in claim 1, wherein forming the at least one first contact pad includes forming the at least one first contact pad on substantially an entire side of the first capacitor structure, the at least one first contact pad being a continuous layer with the first electrode of the first capacitor structure.

7. The method as claimed in claim 2, wherein the at least one first recess extends from an inner side surface of the first opening, the at least one first contact pad is disposed in the at least one first recess, and the first capacitor structure is disposed in the first opening.

8. The method as claimed in claim 1, wherein forming the first capacitor structure includes integrally forming the first electrode and the at least one first contact pad in the first opening.

9. The method as claimed in claim 1, wherein forming the first capacitor structure includes simultaneously forming the first electrode and the at least one first contact pad in the first opening.

10. The method as claimed in claim 1, wherein:
forming the first insulation layer with the first opening includes forming the first opening to include at least one recess protruding away from and in fluid communication with the first opening, a width of the recess along a first direction being smaller than a width of the first opening along the first direction; and
forming the first capacitor structure includes depositing a material of the first electrode to fill the first opening and the at least one recess.

11. The method as claimed in claim 1, wherein forming the first capacitor structure includes forming the first electrode and the at least one first contact pad in direct contact with each other, the first electrode and the at least one first contact pad being inside the first opening.

12. The method as claimed in claim 11, wherein forming the first capacitor structure includes forming uppermost surfaces of the first electrode and the at least one first contact pad substantially coplanar, the uppermost surfaces of the first electrode and the at least one first contact pad facing away from the semiconductor substrate.

13. A method of manufacturing a semiconductor device, comprising:
forming a transistor in a cell region of a substrate, the transistor including a plurality of impurity regions;
forming a first insulation layer including:
a plurality of first contact holes and a first opening, wherein the plurality of first contact holes at least partially exposes the plurality of impurity regions and the first opening at least partially exposes a surface of a logic region of the substrate, and
forming a plurality of second contact plugs within the plurality of first contact holes;
forming at least one third contact plug on at least one of the second contact plugs;
forming a first capacitor structure within the first opening, the first capacitor structure including a first electrode, a first dielectric layer pattern, and a second electrode;
forming a second capacitor structure on the first capacitor structure, the second capacitor structure including a third electrode, a second dielectric layer pattern, and a fourth electrode;
forming at least one first contact pad on a side of the first electrode; and
forming a wiring structure connecting the at least one first contact pad and the fourth electrode.

14. The method as claimed in claim 13, wherein the steps of forming the second contact plugs and the first electrode occur substantially simultaneously.

15. The method as claimed in claim 13, wherein the steps of forming the at least one third contact plug and the third electrode occur substantially simultaneously.

16. The method as claimed in claim 13, wherein the step of forming the at least one first contact pad includes:
forming at least one first recess on an inner side surface of the first opening, and
forming the at least one first contact pad in the at least one first recess.

17. The method as claimed in claim 13, further comprising:
forming a second insulation layer on the first insulation layer, wherein the second insulation layer has a second opening at least partially exposing a surface of the second electrode, and the second capacitor structure is within the second opening; and
forming at least one second contact pad on a side of the third electrode, wherein forming the at least one second contact pad includes:
forming at least one second recess in an inner side surface of the second opening, and
forming the at least one second contact pad in the at least one second recess.

18. The method as claimed in claim 13, wherein forming the at least one contact pad includes forming the at least one first contact pad on substantially an entire side of the first capacitor structure, the at least one first contact pad being a continuous layer with the first electrode of the first capacitor structure.

19. The method as claimed in claim 13, wherein the first insulating layer includes at least one first recess extending from an inner side surface of the first opening, the at least one first contact pad is disposed in the at least one first recess, and the first capacitor structure is disposed in the first opening.

* * * * *